(12) United States Patent
Van Krevel et al.

(10) Patent No.: US 8,945,972 B2
(45) Date of Patent: Feb. 3, 2015

(54) LAYERED SYSTEM FOR PRODUCING A SOLAR CELL ON A METAL SUBSTRATE, METHOD FOR PRODUCING SAID LAYERED SYSTEM

(75) Inventors: Joost Willem Hendrik Van Krevel, Beverwijk (NL); Albertus Johannes Maria Wigchert, Sant-poort-Noord (NL); Ganesan Palaniswamy, Beverwijk (NL)

(73) Assignee: Tata Steel Nederland Technology BV, Ijmuiden (NL)

( * ) Notice: Subject to any disclaimer, the term of this patent is extended or adjusted under 35 U.S.C. 154(b) by 287 days.

(21) Appl. No.: 13/577,410

(22) PCT Filed: Feb. 10, 2011

(86) PCT No.: PCT/EP2011/052002
§ 371 (c)(1),
(2), (4) Date: Aug. 6, 2012

(87) PCT Pub. No.: WO2011/098544
PCT Pub. Date: Aug. 18, 2011

(65) Prior Publication Data
US 2012/0298198 A1    Nov. 29, 2012

(30) Foreign Application Priority Data
Feb. 10, 2010  (EP) .................................... 10001343

(51) Int. Cl.
*H01L 21/00*     (2006.01)
(52) U.S. Cl.
USPC ........................ 438/71; 438/780; 257/E31.13

(58) Field of Classification Search
CPC ........... H01L 2924/15165; H01L 2224/24227; H01L 2224/97; H01L 2924/15153; H01L 2224/82; H01L 31/048; H01L 2224/24225; H01L 2224/95085; H01L 31/0236; H01L 21/02126; H01L 31/1804; H01L 21/02216; H01L 21/02274; H01L 21/02348; H01L 31/02363; H01L 2224/95092; H01L 2224/95122
USPC ................................ 438/71, 780; 257/E31.13
See application file for complete search history.

(56) References Cited

U.S. PATENT DOCUMENTS

2001/0023702 A1 *  9/2001  Nakagawa et al. ........... 136/244

FOREIGN PATENT DOCUMENTS

| AU | 11853/92 B | 7/1992 |
| JP | 62252976 A | 11/1987 |
| JP | 2003298076 A | 10/2003 |
| WO | 9214270 A1 | 8/1992 |

OTHER PUBLICATIONS

Norihiko Inuzuka, JPS62252976 A, English Human Translation, Japan, pp. 1-23.*
International Search Report of Apr. 5, 2011 for Patent Cooperation Treaty application No. PCT/EP2011/052002, to van Krevel et al, filed Feb. 10, 2011.

(Continued)

*Primary Examiner* — Michelle Mandala
(74) *Attorney, Agent, or Firm* — Novak Druce Connolly Bove + Quigg LLP

(57) ABSTRACT

The invention relates to a layered system for producing a solar cell on a metal substrate and to a method of producing the layered system.

23 Claims, 2 Drawing Sheets

(56) References Cited

OTHER PUBLICATIONS

Figure 1:
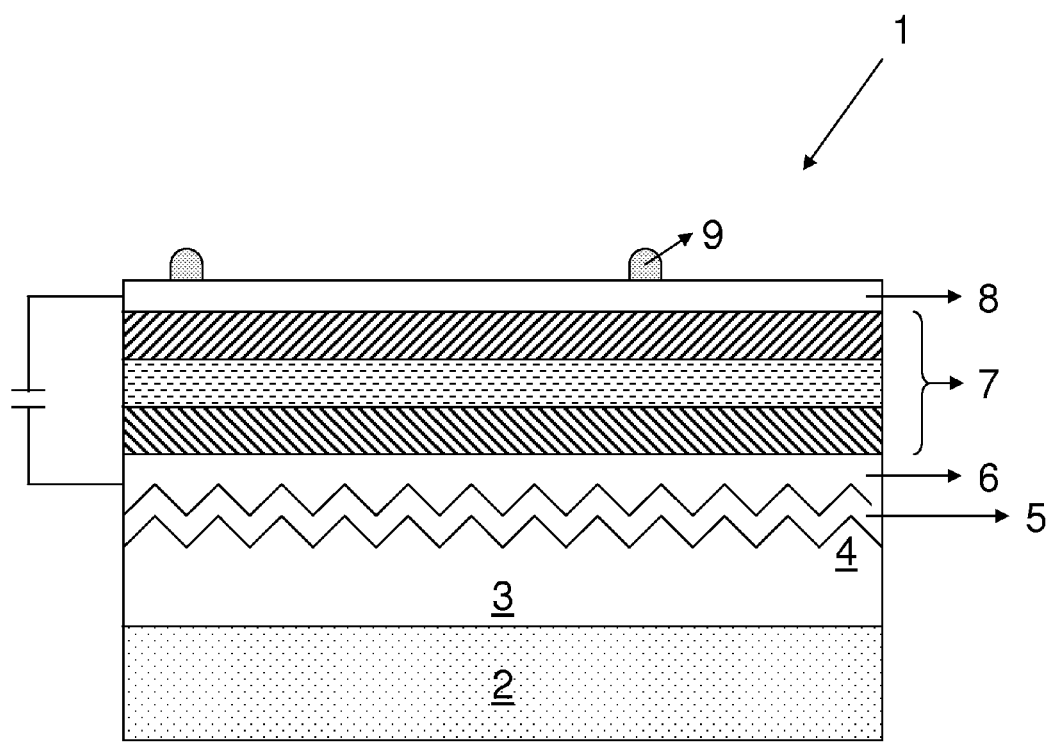

Soppe et al, Roll to Roll Fabrication Process of Thin-Film Silicon Solar Cells on Steel Foil, 24th European Photovoltaic Solar Energy Conference and Exhibition, Sep. 21-25, 2009, Hamburg, Germany.
Van Aken et al, Roll to Roll Fabrication Process of Thin Film Silicon Solar Cells on Steel Foil, Photovoltaic Specialists Conference, (PVSC), 34th IEEE, IEEE, Piscataway, NJ, USA (2009).
Larousse, Dictionary of Science and Technology, 1995.
Wikipedia, Optical Coating, URL: <https://en.wikipedia.org/wiki/Optical_coating#High-reflection_coatings>, retrieved from the Internet Oct. 19, 2014.
Wikipedia, Thin Film Solar Cell, URL: <http://en.wikipedia.org/wiki/Thin_film_solar_cell>, retrieved from the Internet Nov. 11, 2014.
Webster's Online Dictionary, Definition of Crystallise, URL: <http://www.merriam-webster.com/dictionary/crystallise>, retrieved from the Internet Nov. 11, 2014.
Polyimide Resins, Chapter 7 from vol. 21 of ASM Handbook Composites, pp. 105-119 (2001).

\* cited by examiner a.

b.

LAYERED SYSTEM FOR PRODUCING A SOLAR CELL ON A METAL SUBSTRATE, METHOD FOR PRODUCING SAID LAYERED SYSTEM

CROSS-REFERENCE TO RELATED APPLICATIONS

This is a §371 National Stage Application of International Application No. PCT/EP2011/052002 filed on 10 Feb. 2011, claiming the priority of European Patent Application No. 10001343.2 filed on 10 Feb. 2010.

FIELD OF THE INVENTION

The invention relates to a layered system for producing a solar cell on a metal substrate, method of producing said layered system.

BACKGROUND OF THE INVENTION

Owing to demands imposed on future energy requirements coupled with desire for environmentally friendly energy, photovoltaic power generation systems have gained momentum in recent decades and are now being commercially exploited and are growing in prevalence. While the traditional solar cell or photovoltaic device market has advocated cells based on p-n junction silicon wafer-based solar cells which are characterised by high manufacturing costs, recent research efforts are focussed on providing low cost continuous manufacturing processes to provide inexpensive solar cells for photovoltaic power generation systems.

OBJECT OF THE INVENTION

It is an object of the invention to provide a layered system for continuous production of inexpensive solar cells. A further object of the invention is to provide a method for producing such a layered system.

THE INVENTION

In a first aspect of the invention, a layered system for producing a solar cell is provided comprising:
a metal substrate provided with an embossed polymer coating layer for light scattering;
a solar cell back electrode following the shape of the embossed polymer coating layer and having a high light reflectivity;
one or more photovoltaic active layers, which are capable of effectively transforming light into electricity;
a transparent top electrode;
wherein the polymer coating layer comprises a crystallisable polymer.

The metal substrate is impermeable for oxygen and water vapour thus the active material is less exposed to oxygen and water vapour. Metal substrate is a formable substrate for solar cells, giving additional strength as well. Preferably, the metal substrate is a metal which has inherent corrosion protection such as stainless steels, or a metal provided with additional protection against corrosion such as an electroplated mild steel. An additional advantage of such additional protection is that the adhesion between the substrate and the polymer coating layer may be improved. The polymer coating layer electrically isolates the active solar cells from the steel substrate. In this way individual solar cells on the polymer coating layer can be connected in series. This increases the voltage of the assembly. In addition the polymer coating layer provides an additional corrosion protection to the steel substrate. The polymer coating layer needs to be embossed for instance to provide a hologram or a periodic grating. This hologram or grating provides a layer with a rainbow effect. The holograms found on credit cards are examples of rainbow holograms. The effect of these holograms or gratings in the invention is that it increases scattering of light which impinges onto the surface. The scattered light increases the angle of the light towards the surface and increases the light path through the photovoltaic active layers of the solar cell. This improves light absorption into the photovoltaic active layers and increases the performance of the solar cells. The solar cell comprises an active solar cell back electrode following the shape of the embossed polymer coating layer and having a high light reflectivity. The layer with high reflectivity is needed to enhance the reflection of the incoming light. It is necessary that the back electrode follows the shape of the embossed polymer coating to benefit from the embossing to scatter the light. The phrase 'follows the shape' intends to mean that the surface texture resulting from the embossing survives after the application of the back-electrode. If the back-electrode would fill the embossed pattern partly or completely, the scattering enhancing function of the embossing is (partly) lost. The photovoltaic active layer or layers, or series of layers, absorb the light falling onto the system and generate electrons and holes essential for producing electricity. The longer the light travels through these photovoltaic active layer(s), the more light is absorbed by the photovoltaic active layers. As a result more electrons and holes will be generated and as a consequence the efficiency of the solar cell improves. The embossed polymer layer in combination with the solar cell back electrode with a high light reflectivity ensures that the path the light takes through the photovoltaic active layer(s) is prolonged. It is noted that any surface texture of the polymer layer will have a similar effect to a certain extent as surface roughness also scatters the light, particularly when provided with the high reflectivity active solar cell back electrode but uncontrolled surface roughness can create imperfect layers as the layers can not follow the roughness. This reduces the performance of the solar cells and even can cause complete malfunction if imperfect layers cause electrical short cuts. The advantage of an embossed polymer layer is that the scattering of light is controlled and optimised for this purpose. Finally a transparent top electrode is provided to enable the transport of the electrons. Additional layers may be present such as a protective top layer, adhesion layers between polymer layer and substrate or between polymer layer and active back electrode. Also metal fingers and/or busbars may be provided on top of the transparent top electrode to improve electron transport.

In a preferred embodiment of the invention the embossed polymer coating layer is provided with an adhesion layer, such as a chromium oxide layer or an aluminium layer. The purpose of this layer is to improve the adhesion of the solar cell layers onto the polymer coating layer.

In another preferred embodiment of the invention the back electrode preferably has a thickness of between 0.1 and 0.6 µm, preferably wherein the back electrode has a high reflectivity. The back electrode may be a thin metal layer, such as a silver or aluminium layer. Metals, and particularly silver and aluminium have a high reflection coefficient and consequently most of the incoming light is reflected by it. However, for instance for PV cells based on thin photovoltaic active layers of small organic molecules or polymer or hybrid based active donor-acceptor layers system combined with hole conducting and exciton blocking layers non-metallic electrode layers may be used. The thickness of the layer is governed by its function as a back electrode, resulting in a minimum thickness of 0.1 µm. The maximum thickness is governed by the ability to follow the shape of the embossed polymer layer. When the thickness exceeds 0.6 µm, the light scattering effect of the embossed polymer decreases.

In another preferred embodiment of the invention the photovoltaic active layers comprise thin films of photovoltaic active silicon, such as in n(-i-)p-cells, or thin photovoltaic active layers based on small organic molecules or polymer or hybrid based active donor-acceptor layers system combined with hole conducting and exciton blocking layers. The photovoltaic active layer may also comprise tandem cells in which two or more cells are stacked on top of each other, for instance wherein each cell absorbs complementary parts of the solar spectrum. The function of the photovoltaic active layer, which is made of a semiconducting material, is to absorb the photons. These photons bring electrons in the conduction band. The electrons flow through the material to produce electricity. Due to the special composition of solar cells, the electrons are only allowed to move in a single direction. Complementary positive charges, called holes, are also created and flow in the opposite direction to the electrons. An array of solar cells converts solar energy into a usable amount of direct current (DC) electricity.

In another preferred embodiment of the invention an additional scattering layer is provided on the back electrode, and which has a refractive index between that of the back electrode and the photovoltaic active layer, and wherein the scattering layer preferably is a transparent conductive oxide (TCO) such as aluminium doped zinc oxide (ZnO:Al), fluorine-doped tin oxide ($SnO_2$:F or FTO) or indium tin oxide (ITO), and wherein the scattering layer is optionally provided with a silicon-oxide nanolayer. This additional scattering layer further increases the path of the incident photons through the photovoltaic active layer(s) thus increasing the chances of it generating an electron-hole pair.

In another preferred embodiment of the invention the polymer coating layer comprises a crystallisable thermoplastic polymer, such as polyesters like polyethylene terephthalate (PET), polybutylene terephthalate (PBT), polyethylene naphtalate (PEN) or polyolefins such as polypropylene or biaxially oriented polypropylene (BOPP), polyethylene (PE) or polyvinylchloride (PVC). PET has a particular preference because it adheres to a metal substrate very well, and it has a high melting temperature. The current process of producing a solar cell typically involves process steps at temperatures of between 120 and 200° C. The embossing and the polymer layer need to be able to withstand these temperatures and PET has proved to perform well. The PET may be modified with CHDM (1,4-cyclohexanedimethanol) or IPA (isophtalic acid). For similar reasons, polymers like polyamides or polyimide and the like may be suitable as long as they have a sufficiently high melting temperature. Mixtures (blends) or copolymers of the polymers mentioned hereinabove may also be used. The ability to crystallisation of the polymer coating layer ensures that an embossing remains stable during further processing. Preferably the melting temperature of the crystallisable thermoplastic polymer is higher than 200° C., more preferably at least 220° C. If so desired, the polymer layer may be provided with additional fillers, additives, colorants or corrosion inhibitors, such as titania. Preferably the polymer material is well suited for use under vacuum conditions, e.g. during application of the solar cell layers, to prevent vacuum evaporation. The minimum thickness of the polymer coating layer is determined by the breakthrough voltage, whereas the maximum thickness is a cost issue. A suitable minimum thickness of the polymer coating layer is 5 µm, and preferably 7 µm. For polymer-based solar cell technology the processing is initially done at low temperatures, i.e. where crystallisation of the polymer coating does not occur. However, in most cases an after treatment at 120-150° C. is needed to optimally function. In this case embossing and crystallisation is needed to increase the light absorption and reduce crazing due to crystallisation of the polymer after the application of the solar cell layers. A polyester-based coating wherein the crystallisable polymer comprises PET, or a copolymers or blends comprising PET and/or an IPA- or CHDM-modified PET has proven to work excellently.

In another preferred embodiment of the invention the metal substrate is a steel strip or foil, preferably a mild steel provided with a corrosion protection coating or a stainless steel, aluminium or titanium strip. Mild steel substrates with electroplated metal coating are relatively inexpensive and can be provided with a polymer coating layer on an industrial scale reliably and cost effectively. Stainless steel substrates are more expensive than mild steel substrates, but these steels do not require additional protection against corrosion, whereas the mild steel substrates are preferably provided with a protective coating layer such as a nickel or chromium or cobalt or molybdenum and their alloys based plating layer, or a combination thereof, or a chromium-oxide layer such as in the ECCS-steel (also known as tin-free steel). It is also possible to use galvanised steel as a substrate. However, it is not critical for the purpose of this invention which type of coating is used to provide the additional corrosion protection as long as it improves or at least does not impair the adhesion between the polymer coating layer and the substrate. Additional adhesion layers may be provided between the polymer coating layer and the substrate as known from conventional production of polymer coated metal substrates for the packaging industry. The thickness of the metal substrate is mainly determined by the mechanical properties required. Steel substrates preferably have a thickness of between 0.05 and 1 mm. Weight restrictions may limit the maximum thickness, although there is no maximum thickness above which the invention no longer technically functions. The thinner the substrate is, the bigger the risk of damage, creases and wrinkles, during installation and use of the solar cells, thereby potentially damaging the solar cells.

In another preferred embodiment of the invention the embossed polymer coating layer provides a holographic effect. The primary function of the holographic effect is the scattering function to increase the path of the incident photons through the photovoltaic active layer(s). However, the holograms may be useful for counterfeit prevention, brand promotion and product authentication because the hologram may be produced in a form comprising a company logo or a product trade name or trademark.

In a second aspect of the invention, a solar cell is provided comprising a layered system as described hereinabove. The photovoltaic active solar cell layers consist of a stack of thin films of photovoltaic active silicon, such as in n(i-)-p cells. Alternatively, these can be photovoltaic active thin layers based on small organic molecules or polymer or hybrid based active donor-acceptor layers system combined with hole conducting and exciton blocking layers to obtain optimal performance.

In a third aspect of the invention a method of producing a layered system for use in a solar cell is provided comprising the steps of:
   providing a metal substrate provided with a polymer coating layer;

embossing the polymer coating layer to obtain a surface texture for light scattering;

providing an adhesion layer on the embossed polymer coating layer and/or optionally pretreating the polymer coating layer to improve the adhesion;

providing a solar cell back electrode following the shape of the embossed polymer coating layer or the adhesion layer and having a high light reflectivity wherein the electrode follows the thermally embossed polymer coating layer;

one or more photovoltaic active layers, which are capable to effectively transform light into electricity;

a transparent top electrode.

The optional pretreatment may be an oxygen plasma treatment. Oxygen plasma surface treatment not only removes organic residues but also chemically reacts with the surface to form strong covalent carbon-oxygen bonds, which are much more polar and more reactive than the initial carbon-hydrogen bonds. The increased polarity of the surface accounts for the substantial increases in wettability and adds a degree of covalent bonding to the surface-adhesive interface. The polymer layer on the metal substrate is preferably an amorphous or partially crystallised polymer layer. The polymer layer may be provided upon the substrate by laminating a polymer film, which was produced earlier, onto the substrate by known means, or by direct extrusion of a polymer layer onto the substrate by known means, such as by extruding a film through a T-die directly upon the substrate, or onto a casting roll which film is then laminated onto the substrate. These methods for providing a polymer layer onto a substrate are known, for instance from the production of the Protact® polymer coated steel substrates produced for the packaging industry. Protact® is a registered trade name of Tata Steel IJmuiden BV.

In another preferred embodiment of the invention the embossing of the polymer coating layer is brought about by thermal embossing a surface texture such as a hologram or a periodic grating thereby at least partly crystallising the polymer coating layer. The embossing is preferably applied at an embossing temperature comparable to that of the processing temperatures in producing a solar cell which typically involves processing at temperatures of between 120 and 200° C. When PET is used as the polymer layer the PET coating crystallises during the embossing step while at the surface an imprint is pressed. This way a controlled embossed surface is obtained which increases the solar panel performance. The effect of the crystallisation also alleviates any internal stresses that may have been present in the polymer layer as a result of the lamination or extrusion onto the metal substrate. This alleviation or removal of stresses reduces or eliminates the risk of crazing of the solar cell layers during application of these layers or post-processing, because these are often processed at higher temperatures (typically up to 200° C.) or in a plasma environment. If the polymer layer is then still amorphous or partially crystallised, the high temperature will cause it to recrystallise then, causing crazing and complete failure of the solar cell. The embossing temperature is maximised by the temperature at which the polymer starts to stick to the embossing tools (also known as tacking). A minimum temperature is required to achieve crystallisation and to minimise the forces required to achieve the embossing. A suitable minimum temperature for polyesters such as PET was found to be about 120° C. and the maximum about 200° C. These minimum and maximum temperatures may vary slightly for other polymers but in general the temperature range of 120 to 200° C. is useful for all polymer layers suitable for use in a solar cell, i.e. capable of withstanding the typical processing temperatures during manufacture of a solar cell. The thermal embossing cannot be applied after solar cell deposition, because then the solar cell layers craze as a result of crystallisation of the polymer layer. As an alternative, the polymer layer may be embossed prior to lamination onto the metal substrate. In that case the embossing of the polymer coating layer is brought about by laminating a polymer coating layer already provided with a holographic film onto a metal substrate. As a further alternative, the embossing step may be performed during extrusion coating of a polymer film onto a metal substrate followed by embossing the extruded polymer film by means of an embossed casting roll, or an embossing roll mounted in the extrusion-lamination device. As a further alternative, the embossing step may be performed during or after lamination of a prefabricated polymer film by using an embossed lamination roll, or an additional embossing roll mounted in the extrusion-lamination device. As a further alternative, the embossing may be provided by applying a thixotropic coating composition or a sol-gel based composition onto the polymer layer, embossing the surface relief into the coating composition with an embossing device, and curing the embossed coating composition. The thixotropic coating may be provided with conductive properties, e.g. by incorporating conductive particles in it, so that the embossed layer may act as a conductive layer upon which the back electrode may be provided. Again the curing temperature should be chosen such that the polymer coating layer at least partly crystallises to alleviate or remove the internal stresses which might otherwise cause crazing in the solar cell layers. In another embodiment a substrate is provided with a polymer coating which is crystallised thermally after coating the substrate, followed by the coating of the coated substrate with a second coating, which second coating is partially cured, embossed to obtain a surface texture for light scattering and then finish cured. Said second coating may optionally be provided with conductive properties for reasons given above.

In another preferred embodiment of the invention the method comprises one or more of the following steps:

the embossed polymer coating layer is provided with an adhesion layer, such as a chromiumoxide layer or an aluminium layer;

the back electrode is provided as a metal layer, preferably having a thickness of between 0.1 and 0.6 µm, preferably wherein the metal layer has a high reflectivity, such as a silver or aluminium layer;

an additional scattering layer is provided on the back electrode, and which has a refractive index between that of the back electrode and the photovoltaic active layer, and wherein the scattering layer preferably is a transparent conductive oxide such as $ZnO:Al$, $SnO_2:F$ or Indium Tin oxide (ITO), and wherein the scattering layer is optionally provided with a silicon-oxide nanolayer;

a photovoltaic active layer is provided comprising thin films of photovoltaic active silicon, such as in n-i-p-cells, or thin films based on photovoltaic active small organic molecules or polymer or hybrid based active donor-acceptor layers system combined with hole conducting and exciton blocking layers;

a polymer coating layer is provided comprising a crystallisable polymer such as polyethylene terephthalate (PET);

the metal substrate is provided as a steel strip, preferably a mild steel provided with a corrosion protection coating or a stainless steel or aluminium or aluminium alloy strip;

wherein the thermally embossed polymer coating layer provides a holographic effect.

Figures

Figure 2:
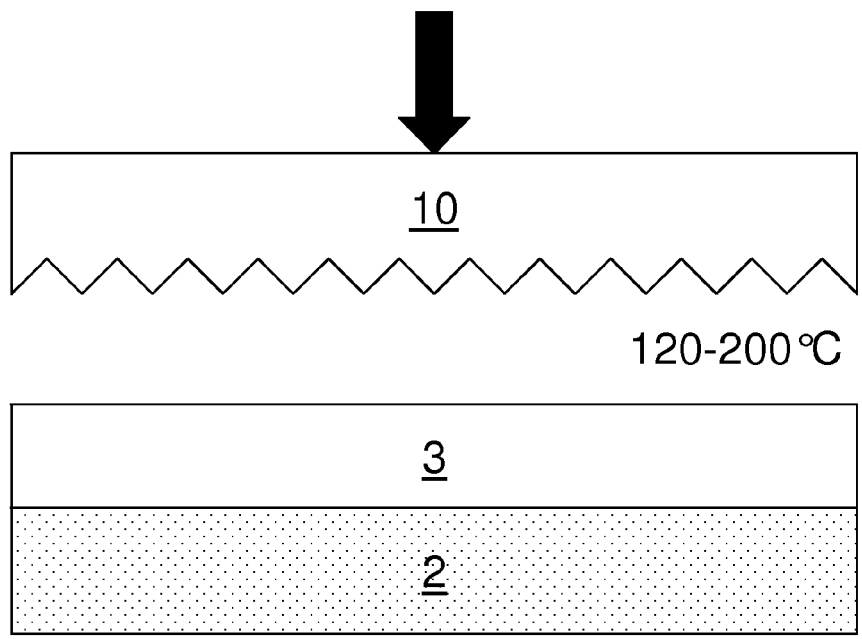
Figure 2:
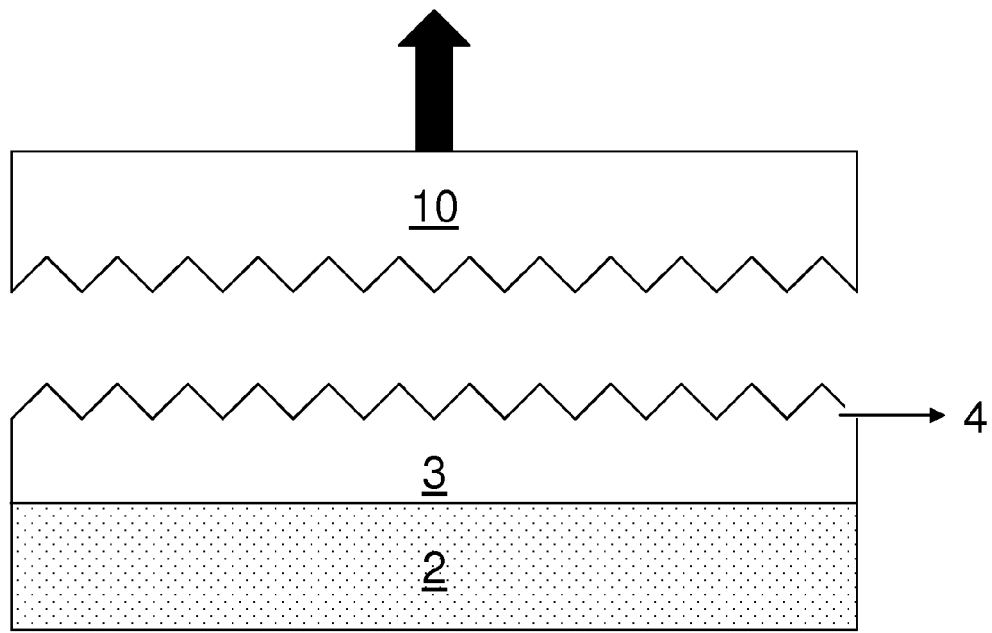

The invention will now be described by means of the following, non limitative and schematic drawings in which FIG. 1 represents the layered system, and FIG. 2 represents the thermal embossing process.

In FIG. 1 a schematic drawing of the layered system 1 is presented (not to scale). The metal substrate 2 is provided with a polymer layer 3 which is provided with an embossed portion 4. The active solar cell back electrode 5 is deposited on top of the embossed portion 4 by known means. Layer 6 is the optional TCO layer and 7 is the photovoltaic active layer. In this non-limitative example a three-layered system, e.g. thin films of photovoltaic active n-i-p-silicon system, is drawn. A TCO top coating 9 is provided on top of the active layers 8 and busbars or fingers 9 are provided for improved electron transport. The potential (4V) is schematically indicated to exist between TCO layer 6 and 9 when light hits the photovoltaic active layer.

In FIG. 2 a schematic drawing of the embossing step is provided. The embossing tool, which is schematically indicated to be a press, but which may also be a roll or any other adequate means to emboss the polymer layer 3. In FIG. 2a the polymer layer is not yet embossed and the embossing tool is moving towards it. The embossing step preferably occurs at elevated temperatures, e.g. between 120 and 200° C. FIG. 2b represents the situation after embossing where the polymer layer 3 is now provided with an embossed portion 4 which, due to the elevated temperature has undergone (partial) crystallisation.

The invention claimed is:

1. A method of producing a layered system for use in a solar cell comprising the subsequent steps of:
   (a) providing a mild steel substrate with a protective coating layer and with a polymer coating layer wherein the polymer coating layer comprises a crystallisable polymer selected from at least one member of the group consisting of polyesters, polyolefins, and polyamides;
   (b) embossing the polymer coating layer to obtain a surface texture for light scattering, wherein the thermal embossing is applied at an embossing temperature of between 120-200° C.;
   (c) providing an adhesion layer on the embossed polymer coating layer and/or optionally pretreating the polymer coating layer to improve the adhesion;
   (d) providing a solar cell back electrode following the shape of the embossed polymer coating layer or the adhesion layer, and having a light reflection coefficient sufficiently high for reflecting most of incoming light wherein the solar cell back electrode is a metal layer having a thickness of between 0.1 and 0.6 μm;
   (e) providing one or more photovoltaic active layers capable to effectively transform light into electricity, wherein the photovoltaic active layer(s) comprise(s)
   thin film of photovoltaic active silicon, or
   thin film based on photovoltaic active organic molecules, or
   polymer or hybrid based active donor-acceptor layers system combined with hole conducting and exciton blocking layers; and
   (f) providing a transparent top electrode,
   wherein
      (i) the embossing of the polymer coating layer is brought about by thermal embossing a surface texture thereby at least partly crystallising the polymer coating layer, or
      (ii) before the embossing the polymer coating layer which is at least partially crystallised is coated with a thixotropic coating composition or a sol/gel based composition as a second coating, which second coating is subsequently at most partially cured, then embossed to obtain a surface texture for light scattering, and then finish cured, or
      (iii) before the embossing the polymer coating layer is coated with a thixotropic coating composition or a sol/gel based composition as a second coating, which second coating is subsequently at most partially cured, then embossed to obtain a surface texture for light scattering, and then finish cured, wherein the polymer coating layer at least partly recrystallises during curing.

2. The method according to claim 1, wherein the mild steel substrate is provided with protective coating layer of a nickel or chromium or cobalt or molybdenum and their alloys based plating layer, or a combination thereof, or with a chromium-oxide layer, or wherein the mild steel substrate is a galvanised steel.

3. The method according to claim 1, wherein the embossed polymer coating layer is provided with the adhesion layer.

4. The method according to claim 3, wherein the adhesion layer is a chromium oxide layer or an aluminium layer.

5. The method according to claim 1, wherein an additional scattering layer is provided on the back electrode, and which has a refractive index between that of the back electrode and the photovoltaic active layer, and wherein the scattering layer is optionally provided with a silicon-oxide nanolayer or a hole conducting or exciton blocking layer.

6. The method according to claim 1, wherein the polymer coating layer comprises said crystallisable polymer selected from at least one member of the group consisting of polyesters.

7. The method according to claim 1, wherein the polymer coating layer comprises said crystallisable polymer selected from at least one polyester selected from the group consisting of polyethylene terephthalate, polybutylene terephthalate or copolymers or blends thereof.

8. The method according to claim 1, wherein the protective coating of the mild steel strip is a corrosion protection coating and wherein the crystallisable polymer consists essentially of poly-ethylene terephthalate.

9. The method according to claim 1, wherein the embossing of the polymer coating layer is brought about by thermal embossing the surface texture thereby at least partly crystallising the polymer coating layer, wherein the thermal embossing is applied at the embossing temperature of between 120-200° C., wherein the polymer of the polymer layer consists of at least one member of the group consisting of polyesters, polyolefins, and polyamides.

10. The method according to claim 1, wherein before the embossing the substrate is provided with the polymer coating layer which is at least partially crystallised, followed by the coating of the coated substrate with the second coating, which second coating is subsequently at most partially cured, embossed to obtain the surface texture for light scattering, and then finish cured.

11. The method according to claim 1, having at least one feature selected from the group consisting of:
   the adhesion layer is a chromium oxide layer or an aluminium layer,
   the back electrode is a silver or aluminium layer
   an additional scattering layer is provided on the back electrode, and which has a refractive index between that of the back electrode and the one or more photovoltaic active layers, and wherein the scattering layer is optionally provided with a silicon-oxide nanolayer, the photovoltaic active layer(s) comprise(s) thin film of photovoltaic active silicon, or thin film based on photovoltaic active organic molecules or polymer or hybrid based active donor-acceptor layers system combined with hole conducting and exciton blocking layers, the thermally embossed polymer coating layer provides a holographic effect.

12. The method according to claim 1, wherein the wherein before the embossing the polymer coating layer is coated with the thixotropic coating composition or the sol/gel based composition as the second coating, which second coating is subsequently at most partially cured, then embossed to obtain the surface texture for light scattering, and then finish cured, wherein the polymer coating layer at least partly recrystallises during curing.

13. The method according to claim 1, wherein the embossing brings about a holographic image for counterfeit prevention, brand promotion and/or product authentication.

14. The method according to claim 1, wherein the polymer coating layer comprises at least one said crystallisable polymer selected from the group consisting of:
said polyesters selected from polyethylene terephthalate, polybutylene terephthalate, polyethylene naphthalate or copolymers or blends thereof,
said polyolefins selected from polypropylene, biaxially oriented polypropylene or polyethylene, or
said polyamide.

15. The method according to claim 1, wherein the back electrode metal layer is a silver or aluminium layer.

16. The method according to claim 5, wherein the scattering layer is a transparent conductive oxide.

17. The method according to claim 16, wherein the transparent conductive oxide is selected from the group consisting of ZnO:Al, SnO$_2$:F or Indium Tin oxide (ITO).

18. The method according to claim 5, wherein the scattering layer is provided with the silicon-oxide nanolayer.

19. The method according to claim 5, wherein the scattering layer is provided with the hole conducting or exciton blocking layer.

20. The method according to claim 1, having at least one feature selected from the group consisting of:
the adhesion layer is a chromium oxide layer or an aluminium layer,
the metal layer is a silver or aluminium layer,
an additional scattering layer is provided on the back electrode, and which has a refractive index between that of the back electrode and the photovoltaic active layer, and wherein the scattering layer is a transparent conductive oxide selected from the group consisting of ZnO:Al, SnO$_2$:F or Indium Tin oxide (ITO), and wherein the scattering layer is optionally provided with a silicon-oxide nanolayer, the photovoltaic active layer(s) comprise(s) thin film of photovoltaic active silicon, or thin film based on photovoltaic active organic molecules or polymer or hybrid based active donor-acceptor layers system combined with hole conducting and exciton blocking layers, the thermally embossed polymer coating layer provides a holographic effect.

21. The method according to claim 1, wherein the polymer coating layer consists of polyethylene terephthalate (PET).

22. The method according to claim 1, wherein an additional scattering layer is provided on the back electrode, and which has a refractive index between that of the back electrode and the photovoltaic active layer, and wherein the scattering layer is a transparent conductive oxide selected from the group consisting of aluminium doped zinc oxide, fluorine-doped tin oxide or indium tin oxide; and
the back electrode metal layer is a silver or aluminium layer,
wherein the polymer coating layer comprises at least one said crystallisable polymer selected from the group consisting of said polyesters selected from polyethylene terephthalate, polybutylene terephthalate, polyethylene naphthalate or copolymers or blends thereof, said polyolefins selected from polypropylene, biaxially oriented polypropylene or polyethylene.

23. The method according to claim 1, wherein the polymer coating layer comprises at least one said crystallisable polymer selected from the group consisting of said polyesters selected from polyethylene terephthalate, polybutylene terephthalate, polyethylene naphthalate or copolymers or blends thereof, said polyolefins selected from polypropylene, biaxially oriented polypropylene or polyethylene, wherein the thermal embossing is applied at an embossing temperature of between 120-150° C. and the substrate has a thickness of between 0.05 and 1 mm, wherein the embossing of the polymer coating layer is brought about by thermal embossing the surface texture thereby at least partly crystallising the polymer coating layer.

* * * * *